(12) United States Patent
Morrison et al.

(10) Patent No.: US 8,352,204 B2
(45) Date of Patent: Jan. 8, 2013

(54) METHOD OF DETECTING SYSTEM FUNCTION BY MEASURING FREQUENCY RESPONSE

(75) Inventors: John L. Morrison, Butte, MT (US); William H. Morrison, Butte, MT (US); Jon P. Christophersen, Idaho Falls, ID (US); Chester G. Motloch, Idaho Falls, ID (US)

(73) Assignee: Battelle Energy Alliance, LLC, Idaho Falls, ID (US)

(*) Notice: Subject to any disclaimer, the term of this patent is extended or adjusted under 35 U.S.C. 154(b) by 283 days.

(21) Appl. No.: 12/772,880

(22) Filed: May 3, 2010

(65) Prior Publication Data
US 2010/0274510 A1    Oct. 28, 2010

Related U.S. Application Data

(63) Continuation-in-part of application No. 12/217,013, filed on Jun. 30, 2008, now Pat. No. 8,150,643, which is a continuation-in-part of application No. 11/825,629, filed on Jul. 5, 2007, now Pat. No. 7,395,163, which is a continuation of application No. 11/313,546, filed on Dec. 20, 2005, now abandoned.

(60) Provisional application No. 60/637,969, filed on Dec. 20, 2004, provisional application No. 60/724,631, filed on Oct. 7, 2005, provisional application No. 61/186,358, filed on Jun. 11, 2009.

(51) Int. Cl.
*G01R 23/00* (2006.01)
*G01R 27/28* (2006.01)
*G01R 31/00* (2006.01)

(52) U.S. Cl. .............................. 702/75; 702/79; 702/117
(58) Field of Classification Search ........................ None
See application file for complete search history.

(56) References Cited

U.S. PATENT DOCUMENTS
5,061,890 A    10/1991    Longini
(Continued)

FOREIGN PATENT DOCUMENTS
JP    2000-009817 A    1/2000

OTHER PUBLICATIONS

PCT International Search Report and Written Opinion of the International Searching Authority for PCT/US11/35052, dated Jul. 26, 2011, 11 pages.

(Continued)

*Primary Examiner* — Janet Suglo
(74) *Attorney, Agent, or Firm* — TraskBritt (57) ABSTRACT

Methods of rapidly measuring an impedance spectrum of an energy storage device in-situ over a limited number of logarithmically distributed frequencies are described. An energy storage device is excited with a known input signal, and a response is measured to ascertain the impedance spectrum. An excitation signal is a limited time duration sum-of-sines consisting of a select number of frequencies. In one embodiment, magnitude and phase of each frequency of interest within the sum-of-sines is identified when the selected frequencies and sample rate are logarithmic integer steps greater than two. This technique requires a measurement with a duration of one period of the lowest frequency. In another embodiment, where selected frequencies are distributed in octave steps, the impedance spectrum can be determined using a captured time record that is reduced to a half-period of the lowest frequency.

22 Claims, 4 Drawing Sheets

U.S. PATENT DOCUMENTS

| | | | |
|---|---|---|---|
| 5,261,007 A * | 11/1993 | Hirsch | 704/237 |
| 5,406,496 A | 4/1995 | Quinn | |
| 5,454,377 A | 10/1995 | Dzwonczyk et al. | |
| 5,512,832 A | 4/1996 | Russell et al. | |
| 5,946,482 A | 8/1999 | Barford et al. | |
| 6,160,382 A | 12/2000 | Yoon et al. | |
| 6,208,147 B1 | 3/2001 | Yoon et al. | |
| 6,249,186 B1 | 6/2001 | Ebihara et al. | |
| 6,262,563 B1 | 7/2001 | Champlin | |
| 6,307,378 B1 | 10/2001 | Kozlowski | |
| 6,481,289 B2 | 11/2002 | Dixon et al. | |
| 6,653,817 B2 | 11/2003 | Tate, Jr. et al. | |
| 6,832,171 B2 | 12/2004 | Barsoukov et al. | |
| 7,065,474 B2 | 6/2006 | Petchenev et al. | |
| 7,395,163 B1 | 7/2008 | Morrison et al. | |
| 7,616,003 B2 | 11/2009 | Satoh et al. | |
| 7,675,293 B2 | 3/2010 | Christophersen et al. | |
| 2002/0065621 A1 * | 5/2002 | Jungerman | 702/75 |
| 2003/0206021 A1 | 11/2003 | Laletin et al. | |
| 2005/0127908 A1 | 6/2005 | Schlicker et al. | |
| 2005/0182584 A1 | 8/2005 | Plusquellic | |
| 2007/0257681 A1 | 11/2007 | Christophersen et al. | |
| 2008/0303528 A1 | 12/2008 | Kim | |
| 2009/0076752 A1 * | 3/2009 | Wang et al. | 702/75 |
| 2010/0010762 A1 * | 1/2010 | Seki | 702/75 |
| 2010/0332165 A1 | 12/2010 | Morrison et al. | |

OTHER PUBLICATIONS

Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.

Ranade et al., An overview of harmonics modeling and simulation, Elect. Power Syst. Res., vol. 74, pp. 37-56, Apr. 2005, Retrieved online at <http://www.calvin.edu/~pribeiro/IEEE/ieee_cd/chapters/pdffiles/c1pdf.pdf>.

Albreht, Weston, "Battery Complex Impedance Identification with Random Signal Techniques," May 4, 2005, Montana Tech of the University of Montana, 99 pages.

Alpaydin, Ethem, "Radial Basis Functions," 2004, Chapter 12.3, pp. 284-290, Introduction to Machine Learning, The MIT Press, Cambridge, Massachusetts, London, England.

Christophersen et al., "Effects of Reference Performance Testing during Aging Using Commercial Lithium-ion Cells," J. Electrochem Soc., 153(7) 2006, pp. A2406-A1416.

Fenton et al., "BSM Development Documentation Senior Project Final Report for the Idaho National Laboratory," May 2005, Montana Tech of the University of Montana, 21 pages.

"FreedomCAR Battery Test Manual for Power-Assist Hybrid Electric Vehicles," manual, Oct. 2003, Appendix D, DOE/ID-11069, Idaho National Laboratory, 130 pages.

Morrison, William H., "Intelligent Self-Evolving Prognostic Fusion, Phase I STTR Interim Report," Jul. 29, 2005, Qualtech Systems, Inc., NASA, Ames Research Center, 23 pages.

Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.

Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.

U.S. Appl. No. 12/217,013, filed Jun. 30, 2008 to Morrison et al., titled, "Method of Detecting System Function by Measuring Frequency Response."

U.S. Appl. No. 13/100,184, filed May 3, 2011 to Christophersen et al., titled, "Crosstalk Compensation in Analysis of Energy Storage Devices."

U.S. Appl. No. 13/100,170, filed May 3, 2011 to Christophersen et al., titled, "In-Situ Real-Time Energy Storage Device Impedance Identification."

Wasserman, Philip D., "Radial Basis-Function Networks," Chapter 8, pp. 147-176, Advanced Methods in Neural Computing, 1993, New York: Van Nostrand Reinhold.

Ziemer et al., "Signals and Linear Systems," 2002, Chapter 2, pp. 56-123, Principles of Communications, 5th edition, John Wiley & Sons.

Christophersen, Electromechanical Spectroscopy Testing on the Advanced Technology Development Program Lithium-ion Cells, IEEE Trans. Veh. Technol., 56(3), 1851-1855 (2002).

Morrison, Fast Summation Transformation for Battery Impedance Identification, Proceedings from the IEEE Aeorspace Conference (2009).

Mix, Dwight F., Random Signal Processing, p. 296, Prentice Hall Publishing Company, 1995.

Christophersen, Impedance Noise Identification for State-of-Health Prognostics, 43rd Power Sources Conference, Jul. 7-10, Philadelphia, PA (2008).

Christophersen, Lumped Parameter Modeling as a Predictive Tool for a Battery Status Monitor, Proceedings from 2003 IEEE Vehicular Technology Conference, Oct. 2003.

Morrison, Real Time Estimation of Battery Impedance, Proceedings from the IEEE Aerospace Conference (2006).

Chapra, Numerical Methods for Engineers, pp. 394-398, McGraw-Hill Publishing Company, 1985.

Smyth, Brian, Development of a Real Time Battery Impeddance Measuring System, M.S. Thesis Montana Tech of the University of Montana, 2008.

PCT International Search Report and Written Opinion of the International Searching Authority for PCT/US2010/038401, dated Dec. 31, 2010, 8 pages.

PCT International Search Report and Written Opinion of the International Searching Authority for PCT/US2010/038358, dated Dec. 31, 2010, 8 pages.

* cited by examiner

METHOD OF DETECTING SYSTEM FUNCTION BY MEASURING FREQUENCY RESPONSE

CROSS-REFERENCE TO RELATED APPLICATIONS

This application is a continuation-in-part of U.S. patent application Ser. No. 12/217,013, filed Jun. 30, 2008, now U.S. Pat. No. 8,150,643, issued Apr. 3, 2012, which is a continuation-in-part of U.S. patent application Ser. No. 11/825,629, filed Jul. 5, 2007, now U.S. Pat. No. 7,395,163, issued Jul. 1, 2008, which is a continuation of U.S. patent application Ser. No. 11/313,546, filed Dec. 20, 2005, now abandoned, which claims the benefit of U.S. Provisional Patent Application Nos. 60/637,969, filed Dec. 20, 2004, and 60/724,631, filed Oct. 7, 2005. This application further claims the benefit of U.S. Provisional Patent Application No. 61/186,358, filed Jun. 11, 2009. The disclosure of each of these applications are hereby incorporated herein by reference in their entirety, including all figures, tables and drawings.

STATEMENT REGARDING FEDERALLY SPONSORED RESEARCH OR DEVELOPMENT

This invention was made with government support under Contract No. DE-AC07-05ID14517 awarded by the United States Department of Energy. The government has certain rights in the invention.

BACKGROUND OF THE INVENTION

Electrochemical impedance measurement systems generally use the Bode analysis as a well-established and proven technique to characterize an impedance of an energy storage device (ESD). The ESD under evaluation is excited with an input signal at a given frequency, and the response is measured. This process is sequentially repeated over a range of frequencies until the impedance spectrum is obtained. This method is effective in assessing ESD degradation over time and usage, but it requires expensive laboratory equipment, and it can be time consuming given the serial measurement approach.

An alternative approach using bandwidth limited noise as an excitation signal can also be used to obtain the impedance more quickly. The electrochemical impedance measurement system response to noise is processed with correlations and Fast Fourier Transform (FFT) algorithms. This technique was developed at the Idaho National Laboratory (U.S. Pat. No. 7,675,293) and successfully applied to various battery technologies (Christophersen et al., 2008). However, this approach requires the average of multiple measurements to adequately determine the impedance response over the desired frequency range, which also makes it more of a serial approach.

Rapid, in-situ acquisition of ESD impedance data over a desired frequency range can be implemented with Compensated Synchronous Detection (CSD) and Fast Summation Transformation (FST). Unlike typical AC impedance measurements and noise analysis methods, these techniques are parallel approaches that require only a single time record to capture the ESD response. As a result, both CSD and FST are well-suited for onboard applications that require impedance measurements as part of an overall smart monitoring system used for control and diagnostics.

Compensated Synchronous Detection (U.S. Pat. No. 7,395,163) is a technique that inputs an excitation signal consisting of a select number of logarithmically distributed frequencies in a sum-of-sines (SOS) configuration. The duration of the SOS excitation signal depends on the frequency step factor and the desired resolution of the impedance spectrum. Typical CSD measurements require a minimum of three periods of the lowest frequency (Morrison et al., "Real Time Estimation of Battery Impedance," *Proceedings from the IEEE Aerospace Conference*, 2006). A time record of the ESD response to the SOS excitation signal is also captured at an appropriate sample rate. The resulting data are used to calculate impedance using synchronous detection to estimate the "In Phase" and the "Quadrature" components at each frequency. Because of cross-talk error, a Compensation Time Record (CTR) is created by reassembling all of the detected responses except for the frequency of interest. This suppresses all of the other frequency components and allows the frequency of interest to be detected with greatly reduced corruption from cross-talk (Morrison et al., "Real Time Estimation of Battery Impedance," *Proceedings from the IEEE Aerospace Conference*, 2006). The CTR is then subtracted from the originally captured response signal, and the result is synchronously detected again. This process is repeated at each frequency of interest to achieve an impedance spectrum with minimal error. The "In Phase" and "Quadrature" components can be easily converted to magnitude and phase angle with simple trigonometric relations.

Fast Summation Transformation (Morrison et al., "Fast Summation Transformation for Battery Impedance Identification," *Proceedings from the IEEE Aerospace Conference*, 2009) is a variation of CSD. It is based on an SOS input signal using octave harmonics to cover the desired frequency range (U.S. Pat. No. 8,150,643). Since cross-talk error is eliminated with octave harmonics, only one period of the lowest frequency is required to complete the measurement and obtain the impedance spectrum. A time record of the ESD response to the SOS excitation signal is also captured at an appropriate sample rate. The FST detection process obtains the "In Phase" and "Quadrature" components by first rectifying the response signal relative to the sine and cosine at each frequency of interest, adding up all the data points in the rectified signal, normalizing to the number of periods of the given frequency, and then storing that result. Results from these rectified responses are placed in a two-element vector (sine and cosine), and multiplied by a conversion matrix (U.S. Pat. No. 8,150,643) to yield the "In Phase" and the "Quadrature" components at the desired frequency. This process is repeated for each of the octave frequencies in the SOS. The "In Phase" and "Quadrature" components can be easily converted to magnitude and phase angle with simple trigonometric relations.

BRIEF SUMMARY OF THE INVENTION

The invention involves using a parallel approach to analyze the impedance or other related system functions. The analysis methodologies described herein are variations of the Fast Summation Transformation (FST) technique. A number of logarithmically distributed frequencies are selected and assembled into an Excitation Time Record (ETR) that consists of a sum-of-sines (SOS) signal. Next, the ETR is conditioned to be compatible with the energy storage device (ESD) under evaluation. The ESD is then excited with the ETR, and the Response Time Record (RTR) is captured. The RTR is synchronized to the ETR and processed by a series of equations to obtain frequency response.

In one preferred embodiment, Generalized Fast Summation Transformation (GFST), the test frequencies included in the SOS signal are increased by an integer greater than two (i.e., N>2, whereas FST is based on N=2). A start frequency is chosen and multiplied by the integer step factor to get the next test frequency, and this process is repeated until the desired frequency range is covered. The resulting test frequencies are then assembled into an ETR as an SOS signal that has a duration of one period of the lowest frequency. The ETR is used to excite the energy storage device, and the response time record is simultaneously captured at an appropriate sample rate (e.g., $N^2$ times the highest frequency in the SOS). The RTR is then processed with the GFST equations described below to estimate the magnitude and phase for each test frequency.

In another preferred embodiment, Reduced Time Fast Summation Transformation (RTFST), the test frequencies are established based on octave harmonics (i.e., N=2). The assembled ETR, however, only requires a duration of a half-period of the lowest frequency (whereas FST required a full period of the lowest frequency). As with FST and GFST, this method also has an ETR that is based on an SOS signal. However, the RTFST signal requires that the second-lowest frequency be eliminated from the SOS composite. For example, if the lowest frequency is 1 Hz, then the SOS signal would include 1 Hz, 4 Hz, 8 Hz, 16 Hz, etc., while omitting the signal at 2 Hz. The ETR is used to excite the energy storage device, and the response time record is simultaneously captured at an appropriate sample rate (e.g., four times the highest frequency in the SOS). To calculate the impedance spectrum, the RTR is first copied, inverted and then concatenated with itself. This new RTR is processed by the RTFST equations described below to estimate the magnitude and phase for each test frequency except the second-lowest frequency. If the missing frequency component is desired, a new ETR is generated with both the lowest and third-lowest frequencies omitted. Using the above example, the new ETR would incorporate frequencies at 2 Hz, 8 Hz, 16 Hz, etc., while rejecting the signals at 1 Hz and 4 Hz. In this case, the ETR will have a duration of a quarter-period of the lowest frequency. Consequently, an impedance spectrum obtained through RTFST can be achieved in half the time as FST if the second-lowest frequency is not required. If it is required, the RTFST can still acquire the impedance spectrum with a reduced time period (0.75 times the speed of FST).

DETAILED DESCRIPTION OF THE INVENTION

A method of the subject invention allows for rapid measurement of the impedance for energy storage devices. It has been shown that shifts in the impedance spectra, as a function of time and use, strongly correlate to the health of, for example, battery technologies (Christophersen et al., "Electrochemical Impedance Spectroscopy Testing on the Advanced Technology Development Program Lithium-Ion Cells," *IEEE Trans. Veh. Technol.*, 56(3). 1851-1855, 2002). Therefore, the subject method provides information about energy storage devices that is critical for onboard diagnostics and state-of-health estimation. The subject method measures a frequency response of an ESD (e.g., a battery) by exciting it with an SOS signal consisting of a number of select frequencies, and then capturing a response time record. The data are processed to obtain the impedance at each frequency in interest.

The desired frequencies are assembled as an excitation time record that can consist of a sum-of-sines signal with a length of, at most, one period of the lowest frequency. The response signal must be measured at a time step that is compatible with Shannon's sampling constraints for the highest frequency component. Individual waveforms could be sine waves of equal amplitude but with alternating phase shifts of 180 degrees between each frequency component. Alternating phase shifts help to minimize any start-up transients. The Root Mean Square (RMS) and the rogue wave peak (i.e., the sum of the absolute values of all component peaks) of the assembled time record must be compatible with the ESD being excited and the Data Acquisition System (DAS) that will capture the response.

The excitation time record is first signal conditioned to be compatible with the ESD under test. As part of the signal conditioning, anti-aliasing filters ensure that only the intended frequencies are passed, while all other frequencies generated by the digital-to-analog conversion process are suppressed. The ESD under test is then excited by the ETR, and a time record of the response is captured by the DAS.

Generalized Fast Summation Transformation (GFST)

Using Fast Summation Transformation (FST), it is possible to identify the individual magnitude and phase for each of the constituents in a sum-of-sines signal using an octave frequency step. With octave harmonics, cross-talk error between the frequency components in the SOS has been completely eliminated. Consequently, the SOS waveform can be rectified in two distinct ways (i.e., relative to the sine and then to the cosine), thus generating two independent equations that are used to find the magnitude and the phase at each frequency of interest.

Figure 1A:
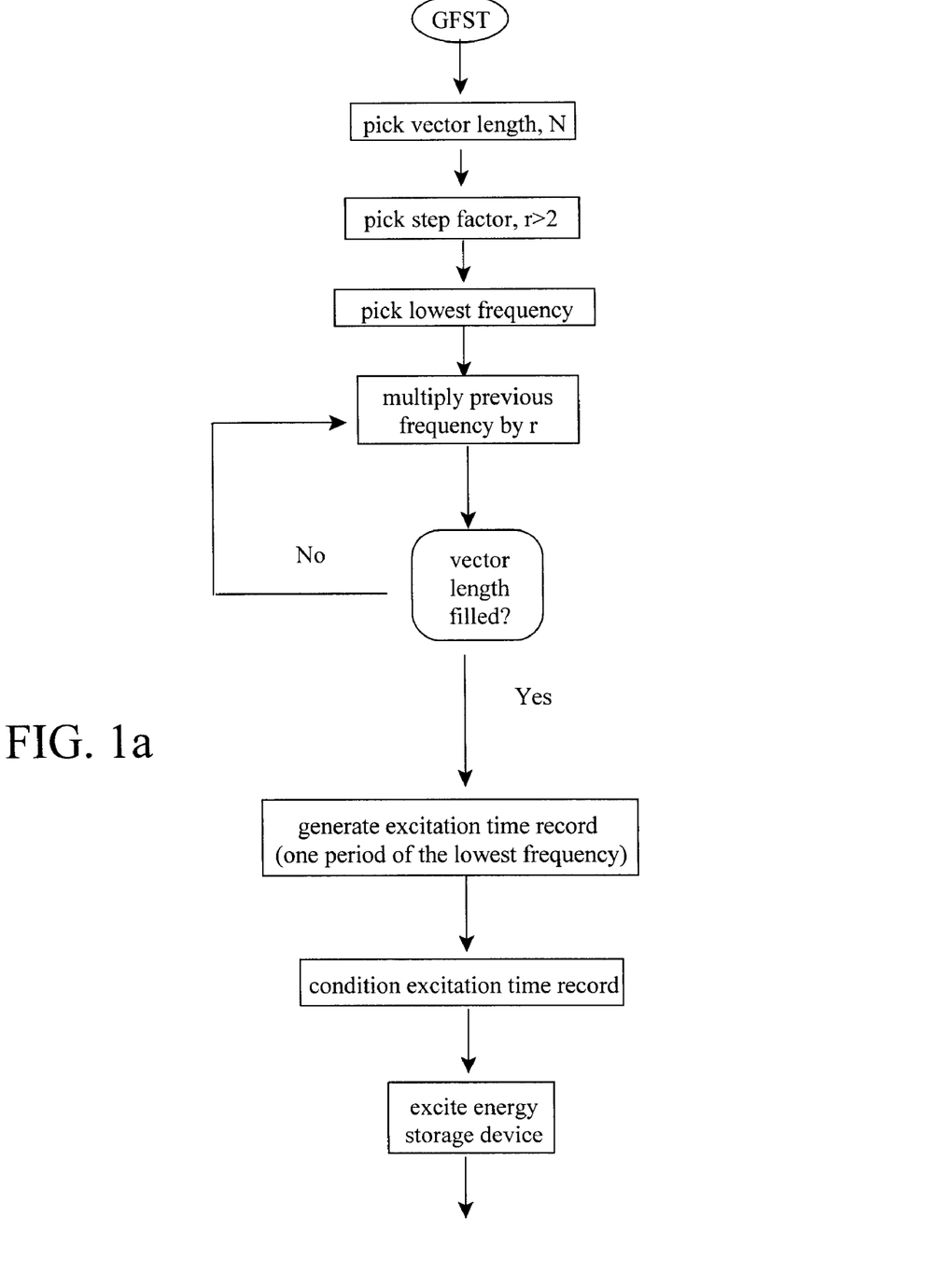
FIGS. 1a and 1b are a flowchart showing a preferred embodiment of a method of the subject invention.
Figure 1B:
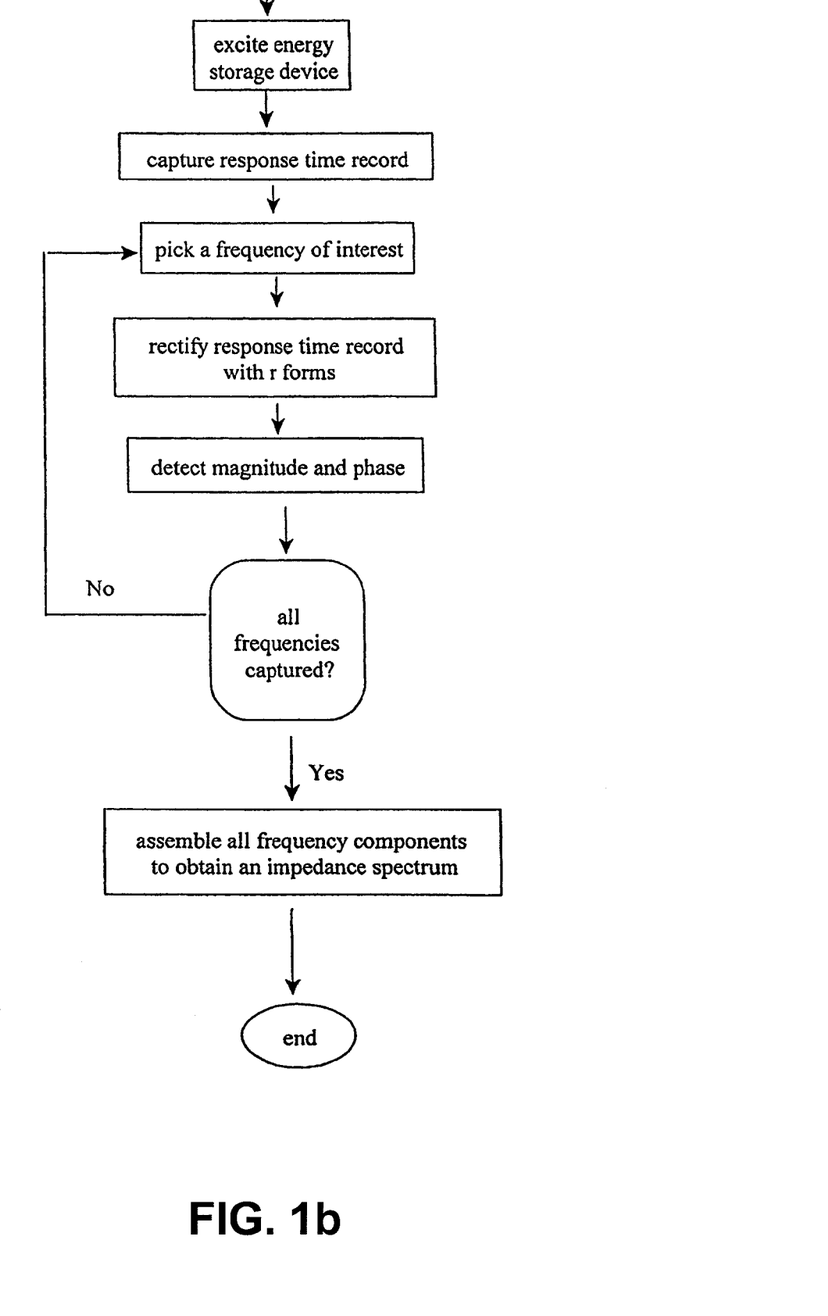

In a preferred embodiment of this invention, the Generalized Fast Summation Transformation (GFST) algorithm is described, where the logarithmic steps can be any integer, N, and not octaves (i.e., N=2). The use of harmonic frequency steps (i.e., integer multipliers) always results in perfect cross-talk rejection. As with FST, the captured response time record must have a duration of at least one period of the lowest frequency, and the sampling frequency should be $N^k$ times faster than the highest frequency in the SOS signal, where $k \geq 2$ and an integer. A flow diagram of the GFST implementation is provided in FIG. 1a and continued in FIG. 1b.

Assuming a frequency step factor of r (i.e., N=r, where r>2), the GFST analysis consists of rectifying the response time record in fractions of 1/r, resulting in r independent relationships. Since r can be greater than two, the system of equations will be over-specified and the impedance calculation should be based on the pseudo-inverse (Mix, "Random Signal Processing," p. 296, *Prentice Hall Publishing Company*, 1995) method. As with the FST algorithm, GFST can be used to identify the impedance spectrum with an SOS input signal. The frequencies in this case will consist of r harmonics. Note, however, that if r is a power of two (e.g., $r=2^2=4$ or $r=2^3=8$), then the FST algorithm can be applied instead.

The validity of this concept is based on the assumption that the summation of the rectification of frequencies other than the one being detected goes to zero, and the pseudo-inverse exists. These assumptions were verified mathematically and with software simulations and shown to be true for SOS signals with a wide variation of amplitude and phase shifts among the frequency components. Thus, GFST can be successfully implemented as a measure of ESD impedance using only one period of the lowest frequency.

Once the SOS signal with a frequency step factor of r has been applied to the ESD, the general form of the captured time record is as given by Equation 1, where $f_{OTHER}(n)$ refers to all of the frequency components except the one of interest.

$$TR(n) = V_P \sin\left(\frac{2\pi}{N}n + \phi_P\right) + f_{other}(n) \quad (1)$$

Where:
$V_P$ is the amplitude of the frequency of interest
TR is the time record
n is the discrete time step related to the sample time Δt $$N = \frac{T}{\Delta t}$$

is the discrete period of the frequency of interest, where
Δt is the sample period
T is the time period of the frequency of interest
$\phi_P$ is the phase angle of the frequency of interest
$f_{other}(n)$ is all of the other frequency components in the time record To detect the desired frequency, Equation 1 is rectified as fractions of the period of that frequency, and the resulting time record is then summed and averaged by the number of periods. The first rectification places the first fraction of the period as positive and all the rest negative; the second rectification makes the second fraction positive and all the rest negative; the $r^{th}$ rectification makes the last $r^{th}$ fraction of the period as positive and all the rest negative. For example, Equation 2 shows that the summation term at the lowest frequency (i.e., $m_1$) component has a positive rectification for the first 1/r of the period, and negative rectification for the rest. Equation 3 shows that summation term at the second lowest frequency (i.e., $m_2$) has a positive rectification for the second 1/r of the period, and negative rectification for the rest. This process is repeated for all frequencies in the SOS signal. The summation term at the highest frequency rectification (i.e., $m_r$) is described by Equation 4, where the last 1/r of the period is made positive and the rest is negative.

$$m_1 = V_P\left\{\sum_{n=0}^{\frac{N}{r}-1} \sin\left(\frac{2\pi}{N}n + \phi_P\right) - \sum_{n=N/r}^{N-1} \sin\left(\frac{2\pi}{N}n + \phi_P\right)\right\} + \quad (2)$$

$$\underbrace{\sum_{n=0}^{\frac{N}{r}-1} f_{other}(n) - \sum_{n=N/r}^{N-1} f_{other}(n)}_{=0 \quad\quad =0}$$

$$m_2 = V_P\left\{-\sum_{n=0}^{\frac{N}{r}-1} \sin\left(\frac{2\pi}{N}n + \phi_P\right) + \right. \quad (3)$$

$$\left. \sum_{n=N/r}^{\frac{2N}{r}-1} \sin\left(\frac{2\pi}{N}n + \phi_P\right) - \sum_{n=2N/r}^{N-1} \sin\left(\frac{2\pi}{N}n + \phi_P\right)\right\} -$$

$$\underbrace{\sum_{n=0}^{\frac{N}{r}-1} f_{other}(n) + \sum_{n=N/r}^{\frac{2N}{r}-1} f_{other}(n) - \sum_{n=2N/r}^{N-1} f_{other}(n)}_{=0 \quad\quad =0 \quad\quad =0}$$

$$m_r = V_P\left\{-\sum_{n=0}^{\frac{(r-1)N}{r}-1} \sin\left(\frac{2\pi}{N}n + \phi_P\right) + \sum_{n=\frac{(r-1)N}{r}}^{N-1} \sin\left(\frac{2\pi}{N}n + \phi_P\right)\right\} - \quad (4)$$

$$\underbrace{\sum_{n=0}^{\frac{(r-1)N}{r}-1} f_{other}(n) + \sum_{n=\frac{(r-1)N}{r}}^{N-1} f_{other}(n)}_{=0 \quad\quad =0}$$

Note that the summations of Equations 2, 3 and 4 are only over one period of the frequency being detected. However, each frequency component except the lowest frequency will contain multiple periods in the overall time record and require correction. Let the number of periods in the time record for the frequency being detected be Q and the sum over the whole time record relative to Equations 2, 3 and 4 be $S_1$, $S_2$, and $S_r$, respectively. Then, $m_1$, $m_2$, and $m_r$ can be related to $S_1$, $S_2$, and $S_r$ by Equation 5.

$$S_1 = Qm_1, S_2 = Qm_2, \ldots S_r = Qm_r. \quad (5)$$

Using the identity of Equation 6, the summation terms $m_1$, $m_2$, and $m_r$ can be modified as shown in Equations 7, 8, and 9.

$$V_P \sin\left(\frac{2\pi}{N}n + \phi_P\right) = V_P \cos(\phi_P)\sin\left(\frac{2\pi}{N}n\right) + V_P \sin(\phi_P)\cos\left(\frac{2\pi}{N}n\right) \quad (6)$$

$$m_1 = V_P\cos(\phi_P)\underbrace{\left\{\sum_{n=0}^{N/r-1} \sin\left(\frac{2\pi}{N}n\right) - \sum_{n=N/r}^{N-1} \sin\left(\frac{2\pi}{N}n\right)\right\}}_{K_{11}} + \quad (7)$$

$$V_P\sin(\phi_P)\underbrace{\left\{\sum_{n=0}^{N/r-1} \cos\left(\frac{2\pi}{N}n\right) - \sum_{n=N/r}^{N-1} \cos\left(\frac{2\pi}{N}n\right)\right\}}_{K_{12}}$$

$$m_2 = \quad (8)$$

$$V_P\cos(\phi_P)\underbrace{\left\{-\sum_{n=0}^{\frac{N}{r}-1} \sin\left(\frac{2\pi}{N}n\right) + \sum_{n=N/r}^{\frac{2N}{r}-1} \sin\left(\frac{2\pi}{N}n\right) - \sum_{n=\frac{2N}{r}}^{N-1} \sin\left(\frac{2\pi}{N}n\right)\right\}}_{K_{21}} + V_P$$

$$\sin(\phi_P)\underbrace{\left\{-\sum_{n=0}^{\frac{N}{r}-1} \cos\left(\frac{2\pi}{N}n\right) + \sum_{n=N/r}^{\frac{2N}{r}-1} \cos\left(\frac{2\pi}{N}n\right) - \sum_{n=\frac{2N}{r}}^{N-1} \cos\left(\frac{2\pi}{N}n\right)\right\}}_{K_{22}}$$

$$m_r = V_P\cos(\phi_P)\underbrace{\left\{-\sum_{n=0}^{\frac{(r-1)N}{r}-1} \sin\left(\frac{2\pi}{N}n\right) + \sum_{n=\frac{(r-1)N}{r}}^{N-1} \sin\left(\frac{2\pi}{N}n\right)\right\}}_{K_{r1}} + \quad (9)$$

$$V_P\sin(\phi_P)\underbrace{\left\{\sum_{n=0}^{\frac{(r-1)N}{r}-1} \cos\left(\frac{2\pi}{N}n\right) + \sum_{n=\frac{(r-1)N}{r}}^{N-1} \cos\left(\frac{2\pi}{N}n\right)\right\}}_{K_{r2}}$$

Equations 7, 8, and 9 can then be solved in matrix form as shown in Equation 10. The results can then be converted to polar form, as shown by Equation 11. This process is repeated for each frequency in the SOS. Using triads as an example (i.e., r=3), the matrix form of the GFST impedance calculation is shown in Equation 12.

$$\begin{bmatrix} V_P\cos\phi_P \\ V_P\sin\phi_P \end{bmatrix} = \qquad (10)$$

$$\left\{ \begin{bmatrix} K_{11} & K_{21} & \cdots & K_{r1} \\ K_{12} & K_{22} & \cdots & K_{r2} \end{bmatrix} \begin{bmatrix} K_{11} & K_{12} \\ K_{21} & K_{22} \\ \vdots & \vdots \\ K_{r1} & K_{r2} \end{bmatrix} \right\}^{-1} \begin{bmatrix} K_{11} & K_{21} & \cdots & K_{r1} \\ K_{12} & K_{22} & \cdots & K_{r2} \end{bmatrix} \begin{bmatrix} m_1 \\ m_2 \\ \vdots \\ m_r \end{bmatrix}$$

$$\begin{matrix} V_P\sin\phi_P = C_1 \\ V_P\cos\phi_P = C_2 \end{matrix}, \text{ then: } \begin{matrix} V_P = \sqrt{C_1^2 + C_2^2} \\ \phi_P = \tan^{-1}\left(\dfrac{C_1}{C_2}\right) \end{matrix} \qquad (11)$$

$$\begin{bmatrix} V_P\cos\phi_P \\ V_P\sin\phi_P \end{bmatrix} = \left\{ \begin{bmatrix} K_1 & K_3 & K_5 \\ K_2 & K_4 & K_6 \end{bmatrix} \begin{bmatrix} K_1 & K_2 \\ K_3 & K_4 \\ K_5 & K_6 \end{bmatrix} \right\}^{-1} \begin{bmatrix} K_1 & K_3 & K_5 \\ K_2 & K_4 & K_6 \end{bmatrix} \begin{bmatrix} m_1 \\ m_2 \\ m_3 \end{bmatrix} \qquad (12)$$

Reduced Time Fast Summation Transformation (RTFST)

It has been shown (Morrison et al., "Fast Summation Transformation for Battery Impedance Identification," *Proceedings from the IEEE Aerospace Conference*, 2009) that it is possible to identify the individual magnitude and phase of each of the constituents of an SOS signal when the frequencies and the sample rate of the SOS are octave harmonics using the Fast Summation Transformation method. When the FST algorithm is applied to the SOS for each frequency constituent, noise cross-talk from the other frequencies present goes to zero regardless of whether those other frequencies are larger or smaller than the one being detected. Additionally, the captured time record length only has to be one period of the lowest frequency.

Figure 2A:
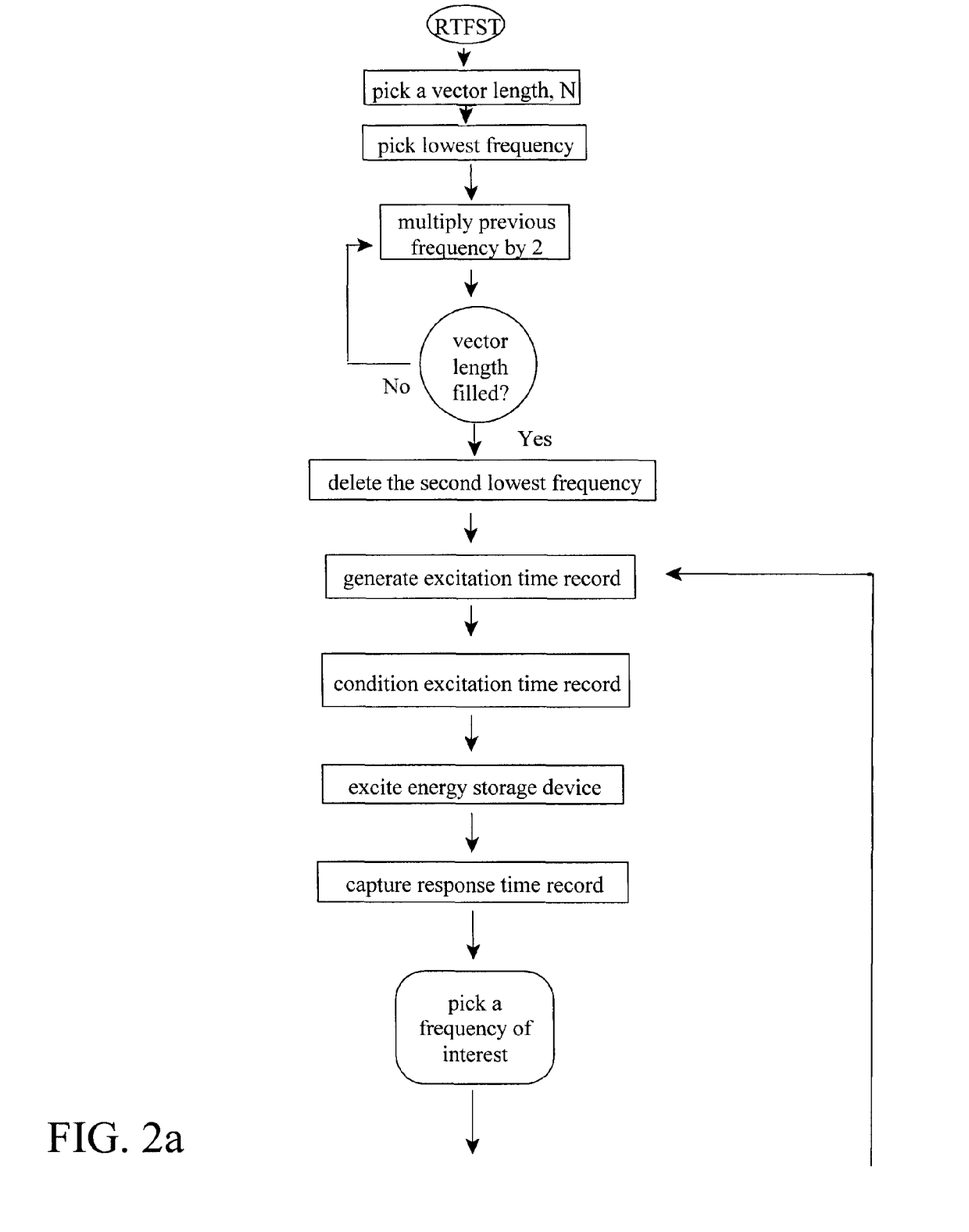
FIGS. 2a and 2b are a flowchart showing another preferred embodiment of a method of the subject invention.
Figure 2B:
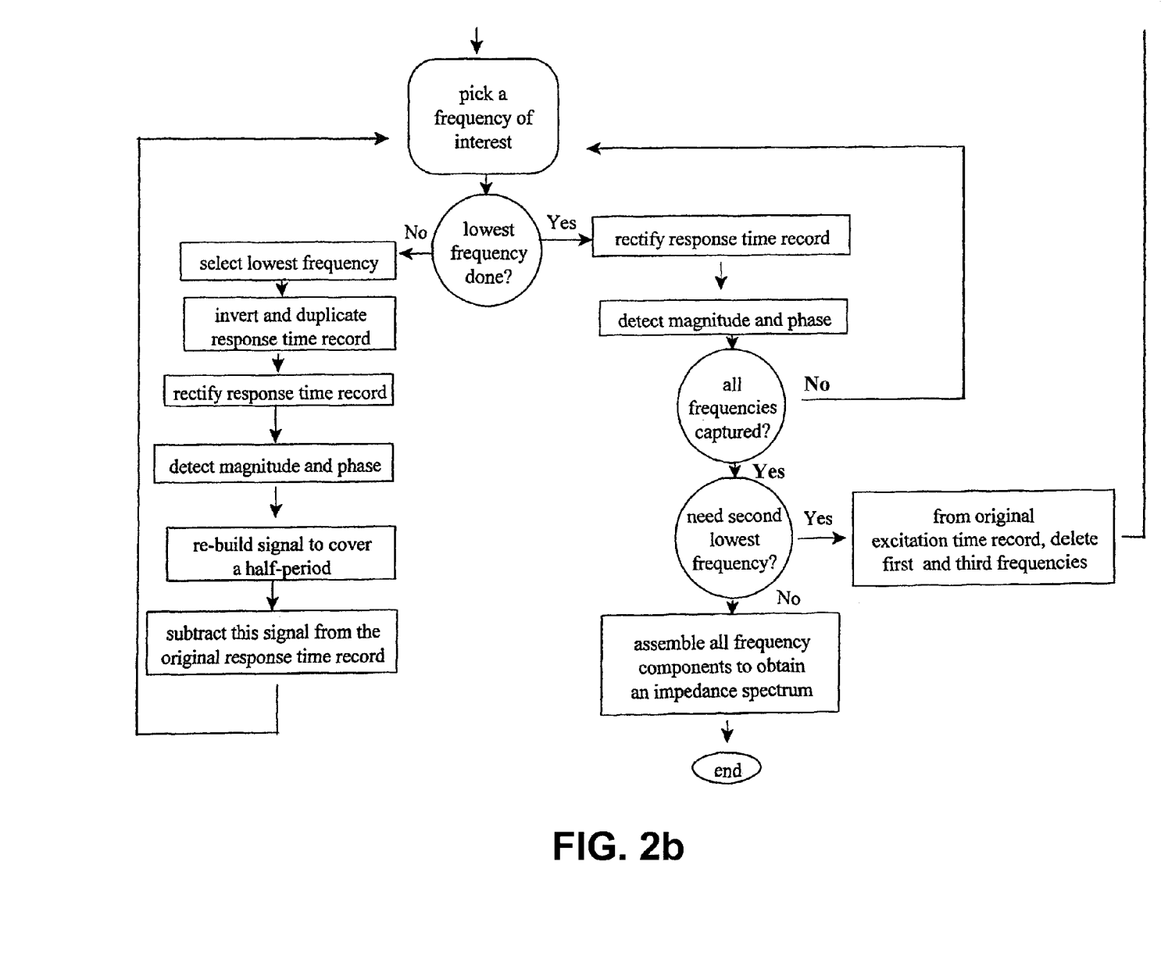

In one preferred embodiment of this invention, the time record for FST can be reduced to half a period of the lowest frequency using Reduced Time Fast Summation Transformation (RTFST). This can be accomplished by generating an octave harmonic SOS signal with all of the frequency components except the second lowest frequency. After the signal is applied to the ESD, the captured time record is also only a half-period of the lowest frequency, but it can be inverted and concatenated to the end of itself to generate a time record covering a full period. The FST analysis algorithm is then applied to detect the magnitude and phase for the lowest frequency. To find the remaining frequency components, the response from the lowest frequency must first be changed back into a half-period time record and subtracted from the original captured time record. Since the remaining frequency components have more than one period in the captured time record, the corresponding magnitudes and phases at each frequency can be detected with the FST algorithm. A flow diagram of the RTFST implementation is provided in FIG. 2a and continued in FIG. 2b.

The resulting impedance spectrum will miss the second lowest frequency, but the measurement can be acquired in half the time as a conventional FST. If the missing frequency is desired, the process can be repeated starting with the second lowest frequency and skipping the third lowest frequency. In other words, a new SOS excitation signal is generated, starting with the second lowest frequency and applied to the ESD. This second measurement can be made in a quarter-period of the lowest frequency. Thus, to generate a full impedance spectrum with all of the frequency components, RTFST can be used to complete the measurement more quickly than FST since it requires only a total of three-quarters of a period of the lowest frequency (i.e., half a period for the initial measurement plus a quarter-period to find the second lowest frequency component).

It should be noted that any DC bias in the measurement other than the half-period of the lowest frequency will generate errors in the analysis. For example, the concatenation process will transform the corrupting DC into error at the lowest frequency and yield inaccurate results. The hardware used to implement this technique must, therefore, filter out any DC bias prior to capturing the ESD response to an RTFST SOS signal that is applied.

The derivation of RTFST starts with the digitized acquired time record as a discrete function, TR(n). The time record is an SOS signal that has a duration of a half-period of the lowest frequency with unknown magnitudes and phases for each of the constituents. The SOS is constrained to be compatible with the FST algorithm (Morrison et al., "Fast Summation Transformation for Battery Impedance Identification," *Proceedings from the IEEE Aerospace Conference*, 2009), except that the second frequency is omitted. Recall that for FST, the SOS frequencies go as octave harmonics and the sample frequency is also octave harmonic (e.g., at least four times faster than the highest frequency in the SOS). The following are defined:

$$T = N\Delta t \qquad (13)$$

$$TR(n\Delta t) \triangleq TR(n)$$

$$P(n) \triangleq u(n) - u\left(n - \frac{N}{2}\right)$$

$$P\left(n - \frac{N}{2}\right) \triangleq u\left(n - \frac{N}{2}\right) - u(n - N)$$

$$PP(n) \triangleq u(n) - u(n - N)$$

Where:

$\Delta t$ is the sample time

T is the period of the lowest frequency in the SOS n is the discrete time

N is the discrete period of the lowest frequency in the SOS u(n) is the discrete time step TR(n) is described in Equation 14 as the product of discrete sine waves and pulse functions, P(n), where $f_{OTHER}(n)$ refers to all of the frequency components except the one of interest. The pulse function truncates the sine wave at the lowest frequency to a half-period as shown in Equation 13 above. Observe that it is assumed there is no DC present in the time record other than from the half-period of the first frequency.

$$TR(n) = \left[V_P\sin\left(\frac{2\pi}{N}n + \phi_P\right) + f_{OTHER}(n)\right]P(n) \qquad (14)$$

Where: $V_P$, $\phi_P$ (i.e., magnitude and phase) need to be detected.

Equation 15 gives an expression for the adjusted time record, where the acquired time record TR(n) for the lowest frequency component is inverted and concatenated to the end of itself. Equation 15 can then be simplified into Equation 16, with the $F_{OTHER}(n)$ components. The FST algorithm (Morrison et al., "Fast Summation Transformation for Battery Impedance Identification," *Proceedings from the IEEE Aerospace Conference*, 2009) is then applied to Equation 16 by first rectifying relative to the sine and summing over the whole record length, as shown in Equation 17.

$$TR(n) = \left[V_P \sin\left(\frac{2\pi}{N}n + \phi_P\right) + f_{OTHER}(n)\right]P(n) - \left[V_P \sin\left(\frac{2\pi}{N}\left(n - \frac{N}{2}\right) + \phi_P\right) + f_{OTHER}\left(n - \frac{N}{2}\right)\right]P\left(n - \frac{N}{2}\right) \quad (15)$$

$$TR(n) = \left[V_P \sin\left(\frac{2\pi}{N}n + \phi_P\right)\right]PP(n) + f_{OTHER}(n)P(n) - f_{OTHER}\left(n - \frac{N}{2}\right)P\left(n - \frac{N}{2}\right) \quad (16)$$

$$m_1 = \sum_{n=0}^{\frac{N}{2}-1} V_P \sin\left(\frac{2\pi}{N}n + \phi_P\right) - \sum_{n=\frac{N}{2}}^{N-1} V_P \sin\left(\frac{2\pi}{N}n + \phi_P\right) + \underbrace{\sum_{n=0}^{\frac{N}{2}-1} f_{OTHER}(n)}_{=0} - \underbrace{\sum_{n=\frac{N}{2}}^{N-1} f_{OTHER}\left(n - \frac{N}{2}\right)}_{=0}, \quad (17)$$

$$m_1 = \sum_{n=0}^{\frac{N}{2}-1} V_P \sin\left(\frac{2\pi}{N}n + \phi_P\right) - \sum_{n=\frac{N}{2}}^{N-1} V_P \sin\left(\frac{2\pi}{N}n + \phi_P\right)$$

The summation of $f_{OTHER}$ in Equation 17 will be zero as it is over an integer number of periods of each frequency within $fO_{THER}$. Since the next frequency in the SOS signal is constrained to be at least four times the first (i.e., the second lowest frequency was omitted), the smallest frequency present in $f_{OTHER}$ will have at least two full periods over the sum, and thus that sum will always be zero. The summation for the cosine rectification is given by Equation 18. As with the sine rectification, the summation of $f_{OTHER}$ in Equation 18 will also always be zero since it includes multiples of a full period at each frequency component within the half-period duration of the lowest frequency.

$$m_2 = \sum_{n=0}^{\frac{N}{4}-1} V_P \sin\left(\frac{2\pi}{N}n + \phi_P\right) - \sum_{n=\frac{N}{4}}^{\frac{3N}{4}-1} V_P \sin\left(\frac{2\pi}{N}n + \phi_P\right) + \sum_{n=\frac{3N}{4}}^{N-1} V_P \sin\left(\frac{2\pi}{N}n + \phi_P\right) + \underbrace{\sum_{n=0}^{\frac{N}{4}-1} f_{OTHER}(n)}_{=0} - \underbrace{\sum_{n=\frac{N}{4}}^{\frac{N}{2}-1} f_{OTHER}\left(n - \frac{N}{2}\right)}_{=0} + \underbrace{\sum_{n=\frac{N}{2}}^{\frac{3N}{4}-1} f_{OTHER}(n)}_{=0} - \underbrace{\sum_{n=\frac{3N}{4}}^{N-1} f_{OTHER}\left(n - \frac{N}{2}\right)}_{=0}, \quad (18)$$

$$m_2 = \sum_{n=0}^{\frac{N}{4}-1} V_P \sin\left(\frac{2\pi}{N}n + \phi_P\right) - \sum_{n=\frac{N}{4}}^{\frac{3N}{4}-1} V_P \sin\left(\frac{2\pi}{N}n + \phi_P\right) + \sum_{n=\frac{3N}{4}}^{N-1} V_P \sin\left(\frac{2\pi}{N}n + \phi_P\right)$$

The trig identity of Equation 6 is applied to Equations 17 and 18, and the resulting summations are shown in Equations 19 and 20. These equations are subsequently solved for $V_P$, $\phi_P$ using the matrix calculation for the FST algorithm, as shown by Equations 21 through 23.

$$m_1 = V_P \cos(\phi_P)\underbrace{\left\{\sum_{n=0}^{\frac{N}{2}-1}\sin\left(\frac{2\pi}{N}n\right) - \sum_{n=\frac{N}{2}}^{N-1}\sin\left(\frac{2\pi}{N}n\right)\right\}}_{K_1} + V_P \sin(\phi_P)\underbrace{\left\{\sum_{n=0}^{\frac{N}{2}-1}\cos\left(\frac{2\pi}{N}n\right) - \sum_{n=\frac{N}{2}}^{N-1}\cos\left(\frac{2\pi}{N}n\right)\right\}}_{K_2} \quad (19)$$

$$m_2 = V_P \cos(\phi_P)\underbrace{\left\{\sum_{n=0}^{\frac{N}{4}-1}\sin\left(\frac{2\pi}{N}n\right) - \sum_{n=\frac{N}{4}}^{\frac{3N}{4}-1}\sin\left(\frac{2\pi}{N}n\right) + \sum_{n=\frac{3N}{4}}^{N-1}\sin\left(\frac{2\pi}{N}n\right)\right\}}_{K_3} + V_P \sin(\phi_P)\underbrace{\left\{\sum_{n=0}^{\frac{N}{4}-1}\cos\left(\frac{2\pi}{N}n\right) - \sum_{n=\frac{N}{4}}^{\frac{3N}{4}-1}\cos\left(\frac{2\pi}{N}n\right) + \sum_{n=\frac{3N}{4}}^{N-1}\cos\left(\frac{2\pi}{N}n\right)\right\}}_{K_4} \quad (20)$$

$$\begin{aligned} m_1 &= V_P \cos\phi K_1 + V_P \sin\phi K_2 \\ m_2 &= V_P \cos\phi K_3 + V_P \sin\phi K_4 \end{aligned} \Rightarrow \begin{bmatrix} m_1 \\ m_2 \end{bmatrix} = \begin{bmatrix} K_1, K_2 \\ K_3, K_4 \end{bmatrix}\begin{bmatrix} V_P \cos\phi \\ V_P \sin\phi \end{bmatrix} \quad (21)$$

$$\begin{bmatrix} V_P \cos\phi \\ V_P \sin\phi \end{bmatrix} = \begin{bmatrix} \frac{K_4}{K_1 K_4 - K_2 K_3}, & \frac{K_2}{K_2 K_3 - K_1 K_4} \\ \frac{K_3}{K_2 K_3 - K_1 K_4}, & \frac{K_1}{K_1 K_4 - K_2 K_3} \end{bmatrix}\begin{bmatrix} m_1 \\ m_2 \end{bmatrix} \quad (22)$$

Let: $\begin{aligned} V_P \sin\phi &= C_1 \\ V_P \cos\phi &= C_2 \end{aligned}$, \quad (23)

then: $\begin{aligned} V_P &= \sqrt{C_1^2 + C_2^2} \\ \phi &= \tan^{-1}\left(\frac{C_1}{C_2}\right) \end{aligned}$ This RTFST development first identifies the magnitude and phase ($V_P$, $\phi_P$) of the lowest frequency component of the SOS signal (TR(n)) with a duration of a half-period. Because that half-period is not orthogonal to any of the higher frequencies, it must be subtracted from TR(n) before the magnitude and phase for the remaining frequency components can be identified. The detected magnitude and phase ($V_P$, $\phi_P$) from the lowest frequency component are used to build a time record that is a half-period in length and it is subtracted from the original TR(n). The standard FST algorithm can then be used to process and identify all the remaining frequency components. The RTFST was tested with software simulations and shown to be true for SOS signals with a wide variation of amplitude and phase shifts among the frequency components. Thus, RTFST can also be successfully implemented as a measure of ESD impedance using only half the period of the lowest frequency.

The FST algorithm has been previously described (Morrison et al., "Fast Summation Transformation for Battery Impedance Identification," *Proceedings from the IEEE Aerospace Conference,* 2009) and is summarized as follows:

Equation 24 (same as Equation 6) represents the sampled signal component at a specific frequency that is to be detected. The amplitude, $V_P$ and phase, $\phi$ at each frequency component are the desired information.

$$V_P \sin\left(\frac{2\pi}{N}n + \phi\right) = V_P \sin\left(\frac{2\pi}{N}n\right)\cos\phi + V_P \cos\left(\frac{2\pi}{N}n\right)\sin\phi \quad (24)$$

Where:

$V_P$ is the amplitude response of the frequency of interest.

N is the number of samples over a period of the frequency of interest.

$\phi$ is the phase response of the frequency of interest.

n is the discrete time index.

In Equation 24, N must be constrained as $\log_2(N)$, and must be an integer greater than one. Additionally, the frequency of interest is given as:

$$f = \frac{1}{N\Delta t} \quad (25)$$

Where: $\Delta t$ is the sample period

In Equations 26 through 28, the signal has been rectified relative to a sine wave of the frequency of interest, and all the sample values are summed together. In Equations 29 through 31, the signal has been rectified relative to the cosine wave of the frequency of interest, and again the samples are summed. Observe that rectification simply involves changing the sign of the sample values relative to the sine wave or cosine wave timing.

$$m_1 = V_P \sum_{n=0}^{\frac{N}{2}-1} \sin\left(\frac{2\pi}{N}n + \phi\right) - V_P \sum_{n=\frac{N}{2}}^{N-1} \sin\left(\frac{2\pi}{N}n + \phi\right) \quad (26)$$

$$m_1 = V_P \sum_{n=0}^{\frac{N}{2}-1} \left(\sin\left(\frac{2\pi}{N}n\right)\cos\phi + \cos\left(\frac{2\pi}{N}n\right)\sin\phi\right) - V_P \sum_{n=\frac{N}{2}}^{N-1} \left(\sin\left(\frac{2\pi}{N}n\right)\cos\phi + \cos\left(\frac{2\pi}{N}n\right)\sin\phi\right) \quad (27)$$

$$m_1 = V_P \cos\phi \underbrace{\left[\sum_{n=0}^{\frac{N}{2}-1}\left(\sin\left(\frac{2\pi}{N}n\right)\right) - \sum_{n=\frac{N}{2}}^{N-1}\left(\sin\left(\frac{2\pi}{N}n\right)\right)\right]}_{K_1} + \quad (28)$$

$$V_P \sin\phi \underbrace{\left[\sum_{n=0}^{\frac{N}{2}-1}\left(\cos\left(\frac{2\pi}{N}n\right)\right) - \sum_{n=\frac{N}{2}}^{N-1}\left(\cos\left(\frac{2\pi}{N}n\right)\right)\right]}_{K_2}$$

$$m_2 = \quad (29)$$

$$V_P \sum_{n=0}^{\frac{N}{4}-1} \sin\left(\frac{2\pi}{N}n + \phi\right) - V_P \sum_{n=\frac{N}{4}}^{3\frac{N}{4}-1} \sin\left(\frac{2\pi}{N}n + \phi\right) + V_P \sum_{n=3\frac{N}{4}}^{N-1} \sin\left(\frac{2\pi}{N}n + \phi\right)$$

$$m_2 = V_P \sum_{n=0}^{\frac{N}{4}-1} \left(\sin\left(\frac{2\pi}{N}n\right)\cos\phi + \cos\left(\frac{2\pi}{N}n\right)\sin\phi\right) - \quad (30)$$

$$V_P \sum_{n=\frac{N}{4}}^{3\frac{N}{4}-1} \left(\sin\left(\frac{2\pi}{N}n\right)\cos\phi + \cos\left(\frac{2\pi}{N}n\right)\sin\phi\right) +$$

$$V_P \sum_{n=3\frac{N}{4}}^{N-1} \left(\sin\left(\frac{2\pi}{N}n\right)\cos\phi + \cos\left(\frac{2\pi}{N}n\right)\sin\phi\right)$$

-continued $$m_2 = \quad (31)$$

$$V_P \cos\phi \underbrace{\left[\sum_{n=0}^{\frac{N}{4}-1}\left(\sin\left(\frac{2\pi}{N}n\right)\right) - \sum_{n=\frac{N}{4}}^{3\frac{N}{4}-1}\left(\sin\left(\frac{2\pi}{N}n\right)\right) + \sum_{n=3\frac{N}{4}}^{N-1}\left(\sin\left(\frac{2\pi}{N}n\right)\right)\right]}_{K_3} +$$

$$V_P \sin\phi \underbrace{\left[\sum_{n=0}^{\frac{N}{4}-1}\left(\cos\left(\frac{2\pi}{N}n\right)\right) - \sum_{n=\frac{N}{4}}^{3\frac{N}{4}-1}\left(\cos\left(\frac{2\pi}{N}n\right)\right) + \sum_{n=3\frac{N}{4}}^{N-1}\left(\cos\left(\frac{2\pi}{N}n\right)\right)\right]}_{K_4}$$

Note that the parameters $K_1, K_2, K_3, K_4$ are known for each frequency and $m_1, m_2$ are the numerical result of the rectifying algorithm for each frequency. The magnitude and phase at each frequency can then be obtained as shown in Equations 32 through 34.

$$\begin{aligned} m_1 &= V_P\cos\phi K_1 + V_P\sin\phi K_2 \\ m_2 &= V_P\cos\phi K_3 + V_P\sin\phi K_4 \end{aligned} \Rightarrow \begin{bmatrix} m_1 \\ m_2 \end{bmatrix} = \begin{bmatrix} K_1, K_2 \\ K_3, K_4 \end{bmatrix} \begin{bmatrix} V_P\cos\phi \\ V_P\sin\phi \end{bmatrix} \quad (32)$$

$$\begin{bmatrix} V_P\cos\phi \\ V_P\sin\phi \end{bmatrix} = \begin{bmatrix} \frac{K_4}{K_1K_4 - K_2K_3}, & \frac{K_2}{K_2K_3 - K_1K_4} \\ \frac{K_3}{K_2K_3 - K_1K_4}, & \frac{K_1}{K_1K_4 - K_2K_3} \end{bmatrix} \begin{bmatrix} m_1 \\ m_2 \end{bmatrix} \quad (33)$$

Let: $\begin{aligned} V_P\sin\phi &= C_1 \\ V_P\cos\phi &= C_2 \end{aligned}$, $\quad (34)$ then: $V_P = \sqrt{C_1^2 + C_2^2}$ $\phi = \tan^{-1}\left(\frac{C_1}{C_2}\right)$ When detecting the magnitude and phase at a given frequency of interest, all of the other frequency components sum to zero. Thus, for this technique, the cross-talk noise is eliminated, and the SOS time record length can be as short as one period of the lowest frequency. However, the FST method only works if the octave harmonic relationship holds for all frequencies in the SOS (including the sample frequency). This ensures that there will always be an even number of samples over a period of any frequency present in the SOS. For rectification, the time record is multiplied by the rectification function relative to the sine and cosine (i.e., change the signs). This process is repeated to obtain the magnitude and phase for each selected frequency to obtain the overall impedance spectra for the ESD. However, for frequencies higher than the first frequency, there will be multiple (Q) periods of that frequency and the resulting summations for $m_1$ and $m_2$ must be normalized to Q.

It is understood that the foregoing examples are merely illustrative of the present invention. Certain modifications of the articles and/or methods employed may be made and still achieve the objectives of the invention. Such modifications are contemplated as within the scope of the claimed invention.

REFERENCES

Christophersen, J. P., D. F. Glenn, C. G. Motloch, R. B. Wright, C. D. Ho, and V. S. Battaglia, "Electrochemical Impedance Spectroscopy Testing on the Advanced Technology Development Program Lithium-Ion Cells," *IEEE Trans. Veh. Technol.*, 56(3), 1851-1855 (2002).

Morrison, J. L., B. Smyth, J. Wold, D. K. Butherus, W. H. Morrison, J. P. Christophersen, C. G. Motloch, "Fast Summation Transformation for Battery Impedance Identification," *Proceedings from the IEEE Aerospace Conference* (2009).

Mix, Dwight F., "Random Signal Processing," p. 296, Prentice Hall Publishing Company (1995).

Christophersen, J. P., et al., "Impedance Noise Identification for State-of-Health Prognostics," 43rd Power Sources Conference, July 7-10, Philadelphia, Pa. (2008).

Christophersen, J. P., C. G. Motloch, C. D. Ho, J. L. Morrison, R. C. Fenton, V. S. Battaglia, and T. Q. Duong,. "Lumped Parameter Modeling as a Predictive Tool for a Battery Status Monitor," *Proceedings from 2003 IEEE Vehicular Technology Conference*, October (2003).

Morrison, J. L. and W. H. Morrison, "Real Time Estimation of Battery Impedance," *Proceedings from the IEEE Aerospace Conference* (2006).

Chapra, Steven C., and Raymond P. Canale, "Numerical Methods for Engineers," pp. 394-398, McGraw-Hill Publishing Company, (1985).

Smyth, Brian, "Development of a Real Time Battery Impedance Measuring System," M.S. Thesis Montana Tech of the University of Montana (2008).

The invention claimed is:

1. A method for detecting function of an energy storage device under test by measuring frequency response, the method comprising the acts of:
generating a vector of frequencies by defining a lowest frequency for the vector of frequencies, defining an integer step factor, multiplying the lowest frequency by the integer step factor to obtain a second frequency for the vector of frequencies, determining subsequent frequencies for the vector of frequencies by multiplying a previous frequency in the vector of frequencies by the integer step factor;
defining a vector of amplitudes and phases corresponding to the frequencies in the vector of frequencies;
assembling an excitation signal using the vector of frequencies and the vector of amplitudes and phases;
conditioning the excitation signal to be compatible with the energy storage device under test;
exciting the energy storage device under test with the conditioned excitation signal for one period of the lowest frequency;
capturing a response time record with a data acquisition system, the response time record comprising a response of the energy storage device to the act of exciting; and
processing the response time record to the frequency domain to obtain the frequency response.

2. The method of claim 1, wherein the integer step factor is greater than 2.

3. The method of claim 1, wherein the excitation signal is a sum-of-sines excitation signal.

4. The method of claim 3, wherein the response time record is captured at a sampling rate that is a step-factor harmonic to the sum-of-sines excitation signal and is at least a step factor squared times a highest frequency in the sum-of-sines excitation signal.

5. The method of claim 1, wherein the response time record is processed by rectifying the response time record relative to various forms.

6. The method of claim 5, wherein the response time record is rectified with r forms, where r is the integer step factor, and N is the number of samples over the period (i.e., $n=n_1, n_2, \ldots, N$), and the first form of the rectification is:

$$R_1(n) = \begin{bmatrix} 1, & 0 \leq n < \dfrac{N}{r} \\ -1, & \dfrac{N}{r} \leq n < N \end{bmatrix}$$

For the $i^{th}$ rectification, where $1<i<r$, the form is as follows:

$$R_i(n) = \begin{bmatrix} -1, & 0 \leq n < \dfrac{(i-1)N}{r} \\ 1, & \dfrac{(i-1)N}{r} \leq n < \dfrac{iN}{r} \\ -1, & \dfrac{iN}{r} \leq n < N \end{bmatrix}$$

for the $i^{th}$ rectification, the form is as follows:

$$R_r(n) = \begin{bmatrix} -1, & 0 \leq n < \dfrac{(r-1)N}{r} \\ 1, & \dfrac{(r-1)N}{r} \leq n < N \end{bmatrix}$$

to obtain a rectified signal.

7. The method of claim 6, wherein each of the r forms are summed up to obtain r different sums including $m_1 \ldots m_r$.

8. The method of claim 7, wherein the summation terms ($m_1 \ldots m_r$) are normalized to the response time record:

$$S_1 = Qm_1, S_2 = Qm_2, \ldots S_r = Qm_r.$$

Where
$m_1 \ldots m_r$ are summation terms of the rectified signal
Q is the number of periods in the response time record for a frequency being detected
$S_1, S_2, \ldots S_r$ are corrected summation terms.

9. The method of claim 8, wherein the rectified signal is used to calculate magnitude and phase of the response time record with:

$$\begin{bmatrix} V_P \cos\phi_P \\ V_P \sin\phi_P \end{bmatrix} = \left\{ \begin{bmatrix} K_{11} & K_{21} & \cdots & K_{r1} \\ K_{12} & K_{22} & \cdots & K_{r2} \end{bmatrix} \begin{bmatrix} K_{11} K_{12} \\ K_{21} K_{22} \\ \vdots \\ K_{r1} K_{r2} \end{bmatrix} \right\}^{-1} \begin{bmatrix} K_{11} & K_{21} & \cdots & K_{r1} \\ K_{12} & K_{22} & \cdots & K_{r2} \end{bmatrix} \begin{bmatrix} m_1 \\ m_2 \\ \vdots \\ m_r \end{bmatrix}$$

Where
$V_P$ is a desired magnitude
$\phi_P$ is a desired phase
$m_1 \ldots m_r$ are summation terms of the rectified signal
$K_{11} \ldots K_{r1}$ are summations of the rectified sine term
$K_{12} \ldots K_{r2}$ are summations of the rectified cosine term.

10. The method of claim 9, wherein the magnitude and phase of the response time record are calculated at each frequency of interest of the vector of frequencies to generate an impedance spectrum of the frequency response.

11. A method for detecting function of an energy storage device under test by measuring frequency response, the method comprising the acts of:
generating a vector of frequencies by defining a lowest frequency for the vector of frequencies, defining an integer step factor, multiplying the lowest frequency by the integer step factor to obtain a second frequency for the vector of frequencies, determining subsequent frequencies for the vector of frequencies by multiplying a previous frequency in the vector of frequencies by the integer step factor, and removing the second frequency from the vector of frequencies;

defining a vector of amplitudes and phases corresponding to the frequencies in the vector of frequencies;

assembling an excitation signal using the vector of frequencies and the vector of amplitudes and phases;

conditioning the excitation signal to be compatible with the energy storage device under test;

exciting the energy storage device under test with the conditioned excitation signal for one-half period of the lowest frequency;

capturing a response time record with a data acquisition system, the response time record comprising a response of the energy storage device to the act of exciting; and processing the response time record to the frequency domain to obtain the frequency response.

12. The method of claim 11, wherein the integer step factor is a factor of two (i.e., r=2, 4, 8, 16, etc.).

13. The method of claim 11, wherein the excitation signal is a sum-of-sines excitation signal.

14. The method of claim 13, wherein the response time record is captured at a sampling rate that is an octave harmonic to the sum-of-sines excitation signal and is at least four times a highest frequency in the sum-of-sines excitation signal.

15. The method of claim 11, wherein the captured response time record is inverted and concatenated to the captured response time record.

16. The method of claim 11, wherein the response time record is processed by rectifying the response time record relative to sine and cosine.

17. The method of claim 16, wherein the response time record is rectified using a method selected from the group consisting of non-zero crossing, with N as the number of samples over the period, the sine waveform of the rectification is:

$$Rs(n) = \begin{bmatrix} 1, & 0 \leq n < \frac{N}{2} \\ -1, & \frac{N}{2} \leq n < N \end{bmatrix}$$

The cosine form is:

$$Rc(n) = \begin{bmatrix} 1, & 0 \leq n < \frac{N}{4} \\ -1, & \frac{N}{4} \leq n < \frac{3N}{4} \\ 1, & \frac{3N}{4} \leq n < N \end{bmatrix}$$

and, zero crossing, with N as the number of samples over the period, the sine waveform of the rectification is:

$$Rs(n) = \begin{bmatrix} 0, & n = 0 \\ 1, & 0 < n < \frac{N}{2} \\ 0, & n = \frac{n}{2} \\ -1, & \frac{N}{2} < n < N \end{bmatrix}$$

The cosine form is:

$$Rc(n) = \begin{bmatrix} 1, & 0 \leq n < \frac{N}{4} \\ 0, & n = \frac{N}{4} \\ -1, & \frac{N}{4} < n < \frac{3N}{4} \\ 0, & n = \frac{3N}{4} \\ 1, & \frac{3N}{4} < n < N \end{bmatrix}$$

to obtain a rectified signal.

18. The method of claim 17, wherein the rectified signal is used to calculate magnitude and phase of the response time record with:

$$\begin{bmatrix} V_P \cos\phi \\ V_P \sin\phi \end{bmatrix} = \begin{bmatrix} \frac{K_4}{K_1 K_4 - K_2 K_3}, & \frac{K_2}{K_2 K_3 - K_1 K_4} \\ \frac{K_3}{K_2 K_3 - K_1 K_4}, & \frac{K_1}{K_1 K_4 - K_2 K_3} \end{bmatrix} \begin{bmatrix} m_1 \\ m_2 \end{bmatrix}$$

Where
$V_P$ is a desired magnitude
$\phi_P$ is a desired phase
$m_1$, $m_2$ are summation terms of the rectified signal
$K_1$, $K_2$ are summations of the rectified sine term
$K_3$, $K_4$ are summations of the rectified cosine term.

19. The method of claim 18, wherein the calculated magnitude and phase of the lowest frequency are used to generate a half-period time record that is subtracted from the response time record.

20. The method of claim 17, wherein the summation terms ($m_1 \ldots m_r$) are normalized to the response time record:

$S_1 = Q m_1, S_2 = Q m_2, \ldots S_r = Q m_r.$

Where
$m_1 \ldots m_r$ are summation terms of the rectified signal
Q is the number of periods in the response time record for a frequency being detected
$S_1, S_2, \ldots S_r$ are corrected summation terms.

21. The method of claim 20, wherein a magnitude and phase response are calculated at each frequency in the vector of frequencies to generate an impedance spectrum of the frequency response.

22. The method of claim 11, further comprising: repeating the acts of claim 11, except:
rather than removing the second frequency, the method includes removing the lowest frequency and a third frequency from the vector of frequencies; and
the energy storage device under test is excited for one-quarter period of the lowest frequency rather than one-half period of the lowest frequency; and
combining the frequency response and a frequency response obtained from the repeated acts to obtain a frequency response with a duration of three-quarters of a period of the lowest frequency.

* * * * *

UNITED STATES PATENT AND TRADEMARK OFFICE
CERTIFICATE OF CORRECTION

PATENT NO. : 8,352,204 B2  
APPLICATION NO. : 12/772880  
DATED : January 8, 2013  
INVENTOR(S) : John L. Morrison et al.

Page 1 of 1

It is certified that error appears in the above-identified patent and that said Letters Patent is hereby corrected as shown below:

On the title page:
In ITEM (75) Inventors: change "William H. Morrison, Butte, MT" to --William H. Morrison, Manchester, CT--

Signed and Sealed this  
Twenty-eighth Day of May, 2013

Teresa Stanek Rea  
*Acting Director of the United States Patent and Trademark Office*